(12) United States Patent
Rikimaru et al.

(10) Patent No.: US 7,942,677 B2
(45) Date of Patent: May 17, 2011

(54) CONDUCTIVE CONTACT AND CONDUCTIVE CONTACT UNIT

(75) Inventors: Taiichi Rikimaru, Kanagawa (JP); Koji Ishikawa, Kanagawa (JP); Jun Tominaga, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 293 days.

(21) Appl. No.: 12/223,983

(22) PCT Filed: Feb. 8, 2007

(86) PCT No.: PCT/JP2007/052258
§ 371 (c)(1),
(2), (4) Date: Aug. 14, 2008

(87) PCT Pub. No.: WO2007/094237
PCT Pub. Date: Aug. 23, 2007

(65) Prior Publication Data
US 2010/0227514 A1    Sep. 9, 2010

(30) Foreign Application Priority Data

Feb. 17, 2006   (JP) ................. 2006-040746

(51) Int. Cl.
*H01R 12/00*    (2006.01)
(52) U.S. Cl. .......................... 439/66; 334/761
(58) Field of Classification Search ............ 439/66, 439/824, 700, 69, 189, 287, 862; 334/761
See application file for complete search history.

(56) References Cited

U.S. PATENT DOCUMENTS

| 4,773,877 | A  | * | 9/1988  | Kruger et al. .............. 439/482 |
| 5,967,856 | A  | * | 10/1999 | Meller ....................... 439/700 |
| 6,083,059 | A  | * | 7/2000  | Kuan .......................... 439/862 |
| 6,299,458 | B1 | * | 10/2001 | Yamagami et al. ......... 439/66 |
| 6,524,140 | B2 | * | 2/2003  | Takagi et al. .............. 439/700 |
| 6,783,405 | B1 | * | 8/2004  | Yen ............................. 439/824 |

(Continued)

FOREIGN PATENT DOCUMENTS

JP    11-133060    5/1999

(Continued)

OTHER PUBLICATIONS

International Search Report, Mar. 6, 2007, issued in PCT/JP2007/052258.

*Primary Examiner* — T C Patel
*Assistant Examiner* — Harshad C Patel
(74) *Attorney, Agent, or Firm* — Edwards Angell Palmer & Dodge LLP

(57) ABSTRACT

A conductive contact includes a first contacting element that is brought into contact with one of different circuitries; a second contacting element that is brought into contact with another one of the different circuitries; a resilient element that is interposed between the first contacting element and the second contacting element to be expandable and contractible in a longitudinal direction; a first connecting element that connects the resilient element and the first contacting element; and a second connecting element that connects the resilient element and the second contacting element, and has an opening penetrating therethrough in a through-thickness direction. At least a portion of the resilient element is shorter than the first connecting element and the second connecting element in a width direction perpendicular to the longitudinal direction and the through-thickness direction.

10 Claims, 11 Drawing Sheets

U.S. PATENT DOCUMENTS

| | | | |
|---|---|---|---|
| 6,855,010 B1 * | 2/2005 | Yen | 439/700 |
| 6,967,492 B2 * | 11/2005 | Tsui et al. | 324/754 |
| 7,040,935 B2 * | 5/2006 | Wei | 439/700 |
| 7,179,133 B2 * | 2/2007 | Forell et al. | 439/700 |
| 7,270,550 B1 * | 9/2007 | Peng | 439/66 |
| 7,270,558 B1 * | 9/2007 | Chiang | 439/289 |
| D555,096 S * | 11/2007 | Peng | D13/133 |
| D556,135 S * | 11/2007 | Dwan et al. | D13/133 |
| 7,335,068 B2 * | 2/2008 | Dwan et al. | 439/700 |
| 7,344,423 B2 * | 3/2008 | Sato et al. | 439/884 |
| 2005/0064766 A1 * | 3/2005 | Zhang et al. | 439/700 |

FOREIGN PATENT DOCUMENTS

| | | |
|---|---|---|
| JP | 2000-046870 | 2/2000 |
| JP | 2001-324515 | 11/2001 |
| JP | 2001-343397 | 12/2001 |
| JP | 2003-307525 | 10/2003 |
| JP | 2004-144663 | 5/2004 |
| JP | 2004-170360 | 6/2004 |

* cited by examiner

CONDUCTIVE CONTACT AND CONDUCTIVE CONTACT UNIT

TECHNICAL FIELD

The present invention relates to a conductive contact that is brought into contact with an electrode or a terminal of an electronic component and transmits and receives an electrical signal upon testing the conducting state and operating characteristics of the electronic component such as a liquid crystal panel or a semiconductor integrated circuit, and a conductive contact unit using the conductive contact.

BACKGROUND ART

In a technological field of electrical characteristic testing of a test object such as a semiconductor integrated circuit, there is a known technology related to a conductive contact unit. The conductive contact unit includes a plurality of conductive contacts, each of which is arranged correspondingly to a connecting terminal of the semiconductor integrated circuit, and provides electrical conductivity by bringing the conductive contacts into physical contact with the connecting terminals. A structure of the conductive contact includes at least the conductive contacts and a conductive contact holder for holding the conductive contacts. Along with a trend to miniaturize the semiconductor integrated circuit that is a test object, various technologies have been suggested for the conductive contact unit to narrow the intervals between the arranged conductive contacts so that smaller intervals of connecting terminal arrangement can be accommodated.

As one of the examples of the conductive contacts that achieve narrower arrangement intervals, there has been suggested a plate-shaped conductive member structure that is integrated with a contacting element that is brought into contact with the test object, and a resilient element that applies a resilient force to the contacting element. By arranging the plate-like conductive contacts in a through-thickness direction, it becomes theoretically possible, according to this technology, to arrange a number of conductive contacts in a small space. In this manner, a conductive contact that can support the narrower arrangement intervals of the connecting terminals of the test object can be achieved. (For example, see Patent Document 1 listed below.)

[Patent Document 1] Japanese Patent Application Laid-open Number 2001-343397

DISCLOSURE OF INVENTION

Problem to be Solved by the Invention

The conductive contact shrinks upon application of a load during testing of a substrate, and needs to be restored to its original position using a restoring force of the resilient element to finish the testing. With the above known conductive contact, because the resilient element has the same width as that of guiding grooves, slide movement of the resilient element causes friction between the guiding grooves and the resilient element. If the friction is large, the resilient element may be caught up with the guiding grooves, failing to being restored to its original position. In such a case, if an increased load is applied to the conductive contact to enable the resilient element to be reliably restored to its original position, the resilient force exceeds the rigidity of the tip of the conductive contact, which may cause deformation of the tip.

Because the resilient element slides to the guiding grooves while being resiliently deformed, the behavior of the resilient element each time being resiliently deformed is not constant and can vary. This causes variation also in the frictional force to be generated between the resilient element and the guiding grooves, resulting in a larger variation in test loads.

Further, due to the friction, wear powder is generated. The generated wear powder might contaminate a test object, reducing the durability of the conductive contact itself.

The present invention has been achieved to solve the above problems in the conventional technology and it is an object of the present invention to provide a conductive contact capable of being reliably restored to its original position with less variation in loads as well as having high durability, and a conductive contact unit using the conductive contact.

Means for Solving Problem

According to an aspect of the present invention, a conductive contact in a plate-like shape that establishes an electrical connection between different circuitries, and receives and outputs an electrical signal from and to the circuitries, may include: a first contacting element that is brought into physical contact with one of the different circuitries; a second contacting element that is brought into physical contact with one of the different circuitries other than the one the first contacting element is brought into contact with; a resilient element that is interposed between the first contacting element and the second contacting element along a longitudinal direction, and is expandable and contractible in the longitudinal direction; a first connecting element that connects the resilient element and the first contacting element; and a second connecting element that connects the resilient element and the second contacting element, and has an opening penetrating therethrough in a through-thickness direction. At least a portion of the resilient element may be shorter than the fist connecting element and the second connecting element in a width direction perpendicular to the longitudinal direction and the through-thickness direction.

In the conductive contact, the second contacting element may project from an edge in the width direction of the second connecting element in a direction away from a center of the conductive contact.

In the conductive contact, the resilient element may have at least a portion whose edge, on a side of an edge in the width direction of the second connecting element opposite the edge from which the second contacting element projects, is retracted toward the center of the conductive contact more than the edge in the width direction of the second connecting element.

In the conductive contact, the resilient element may have at least a portion whose edge, on a side of the edge in the width direction of the second connecting element from which the second contacting element projects, is retracted toward the center of the conductive contact more than the edge in the width direction of the second connecting element.

In the conductive contact, the resilient element may have portions that have different lengths in the width direction.

The conductive contact may further include at least one plate element that divides the resilient element into pieces to be arranged along the longitudinal direction.

In the conductive contact, the plate element may be equal in length in the width direction to the first connecting element and/or the second connecting element.

According to another aspect of the present invention, a conductive contact unit may include: a plurality of conductive contacts, each of which may include a first contacting element that is brought into physical contact with one of different circuitries, a second contacting element that is brought into physical contact with one of the different circuitries other than the one the first contacting element is brought into contact with, a resilient element that is interposed between the first contacting element and the second contacting element along a longitudinal direction and is expandable and contractible in the longitudinal direction, a first connecting element that connects the resilient element and the first contacting element, and a second connecting element that connects the resilient element and the second contacting element and has an opening penetrating therethrough in a through-thickness direction; a conductive contact holder that may accommodate the conductive contacts and includes a plurality of first guiding grooves each engaging one longitudinal edge of one of the conductive contacts to hold the conductive contact, and a plurality of second guiding grooves each located opposite to corresponding one of the first guiding grooves and engaging another edge of the conductive contact than the one the corresponding first guiding groove engages to hold the conductive contact; and a bar-shaped member that may penetrate through the opening formed on the second connecting element of each of the conductive contacts accommodated in the conductive contact holder and is fixed to the conductive contact holder. In each of the conductive contacts, at least a portion of the resilient element may be shorter than the fist connecting element and the second connecting element in a width direction perpendicular to the longitudinal direction and the through-thickness direction.

In the conductive contact unit, a cross-sectional area of the bar-shaped member perpendicular to a longitudinal direction may be smaller than an area of the opening formed on each of the conductive contacts.

EFFECT OF THE INVENTION

According to an aspect of the present invention, the conductive contact is capable of being reliably restored to its original position with less variation in the loads as well as having high durability.

BRIEF DESCRIPTION OF DRAWINGS

FIG. 6-1 is a diagram of the conductive contact unit according to the first embodiment immediately after being brought into contact with a test object.

FIG. 6-2 is a diagram of the conductive contact unit according to the first embodiment with the test object elevated to a test position.

Figure 1:
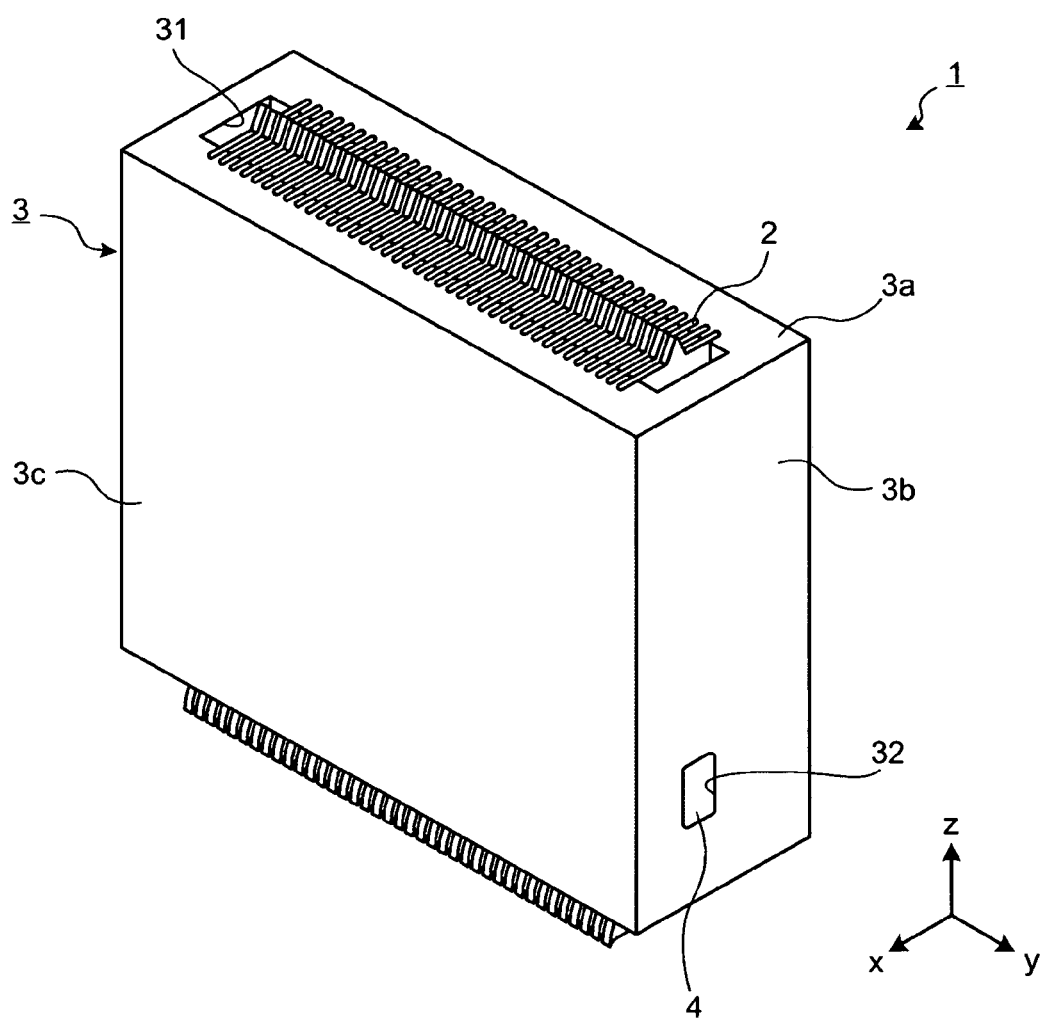
FIG. 1 is a perspective view of a structure of a conductive contact unit according to a first embodiment of the present invention.

EXPLANATIONS OF LETTERS OR NUMERALS 1 conductive contact unit
2, 5, 6, 7, 8 conductive contact
3 conductive contact holder
3a upper wall
3b, 3c side wall
3d bottom wall
4 bar-shaped member
21, 51, 61, 71, 81 first contacting element
22, 52, 62, 72, 82 second contacting element
23, 53, 63, 74a, 74b, 84a, 84b, 84c resilient element
24, 54, 64, 75, 85 first connecting element
25, 55, 65, 76, 86 second connecting element
26, 56, 66, 77, 87 opening
31 supporting element
32 fastening hole
31a first guiding groove
31b second guiding groove
73, 83a, 83b plate element
100 circuit substrate
101 fixing member
200 test object
$P_1$ initial contacting point
$P_2$ final contacting point
$\Delta_1$ offset
$\delta_1$, h projected length
r retracted amount

BEST MODE(S) FOR CARRYING OUT THE INVENTION

Best modes for carrying out the present invention (hereinafter, "embodiments") are described below with reference to the attached drawings. It should be noted that the drawings are just schematic representations, and that the relation between the thickness and width of each element, or a thickness ratio of each element may be different from those actually measured. Moreover, it should be obvious that the relationship or ratio of dimensions may be different in each of the drawings.

First Embodiment

FIG. 1 is a perspective view of a structure of a conductive contact unit according to a first embodiment of the present invention. A conductive contact unit 1, shown in FIG. 1, is used for testing the conducting state or operating characteristics of a circuitry of a test object, such as a liquid crystal panel. The conductive contact unit 1 includes a plurality of conductive contacts 2 in a plate-like shape, a conductive contact holder 3 that contains the conductive contacts 2, and a bar-shaped member 4 that is fastened to the conductive contact holder 3 and supports the conductive contacts 2.

Figure 2:
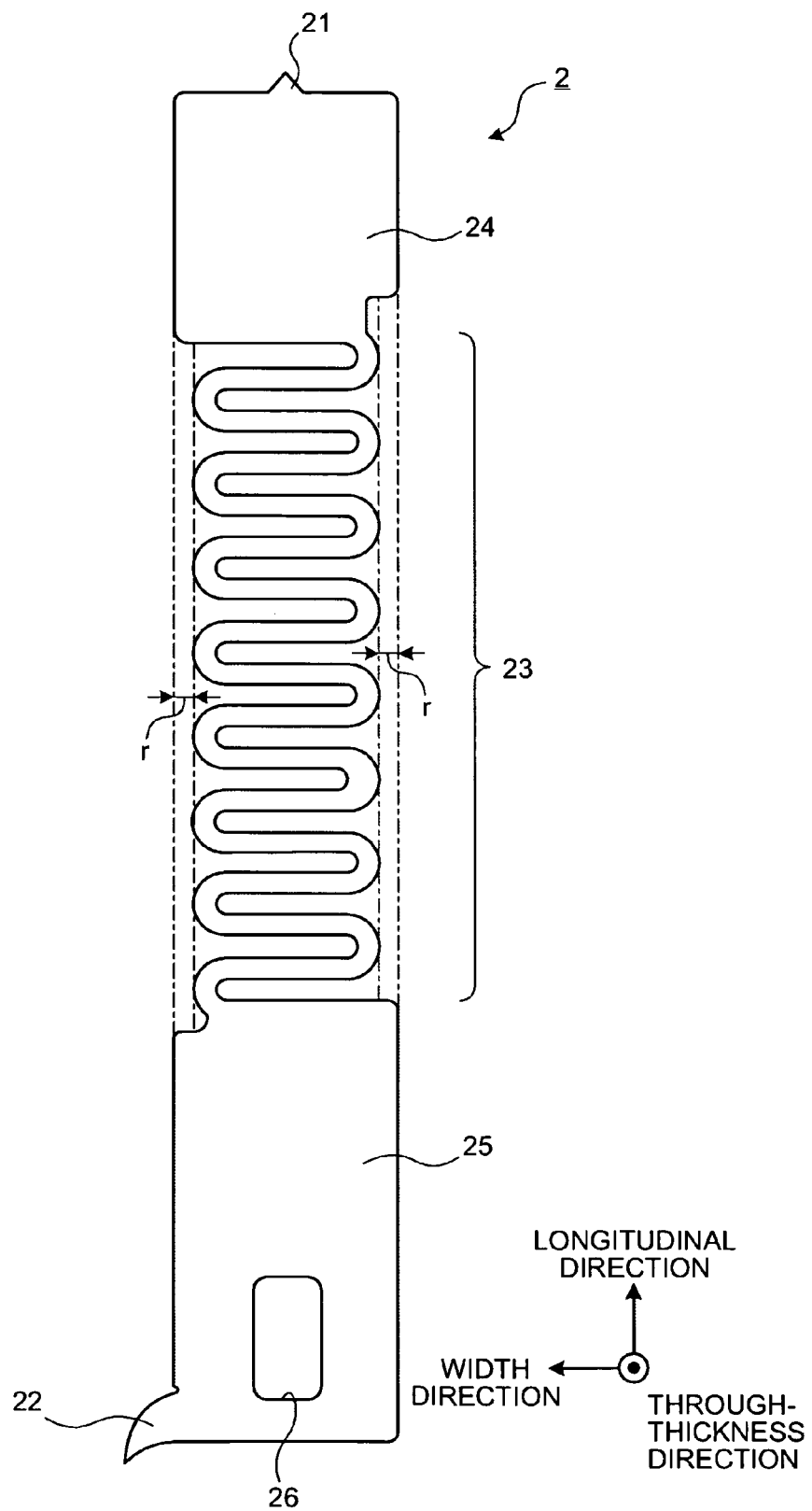
FIG. 2 is a diagram of a structure of a conductive contact according to the first embodiment.

The conductive contact 2 is explained in detail below. FIG. 2 is a diagram of a structure of the conductive contact 2 according to the first embodiment. In the following description, the vertical direction in FIG. 2 is referred to as a "longitudinal direction of the conductive contact 2", the horizontal direction in FIG. 2 is referred to as a "width direction of the conductive contact 2", and the direction intersecting with the longitudinal direction and the width direction that mean the direction perpendicular to a paper surface is referred to as a "through-thickness (thickness) direction of the conductive contact 2".

The conductive contact 2 shown in FIG. 2 is provided to establish an electrical connection between different circuitries. The conductive contact 2 includes: a first contacting element 21 that is brought into physical contact with a predetermined circuitry (specifically, a circuitry having a test circuit); a second contacting element 22 that is brought into physical contact with a circuitry other than that brought into contact with the first contacting element 21 (specifically, a test object such as a liquid crystal display); a spring-like resilient element 23 that is interposed between the first contacting element 21 and the second contacting element 22, and is extensible in the longitudinal direction; a first connecting element 24, and connecting the first contacting element 21 and the resilient element 23; and a second connecting element 25, connecting the second contacting element 22 and the resilient element 23, and having an opening 26 penetrating therethrough in the through-thickness direction.

The second contacting element 22 projects from a width-direction edge of the second connecting element 25, in a direction away from the center of the conductive contact 2. The resilient element 23 has a width (a length in the width direction) smaller than the width of the first connecting element 24 and the second connecting element 25 by 2r, so that edges of the resilient element 23 are retracted toward the center of the conductive contact 2 in the width direction than edges of the first connecting element 24 and the second connecting element 25. Such retracted amounts (denoted as "r") of the resilient element 23 are equally provided from the both respective edges of the first connecting element 24 (and the second connecting element 25) in the width direction. A specific value for the retracted amount r is decided according to the groove depth of guiding grooves (described later) for holding the resilient element 23 in the conductive contact holder 3 or other factors.

The shape of the second contacting element 22 should be decided depending on various conditions, such as the material used for the conductive contact 2, the load that should be applied to the conductive contact 2 during the testing, the shape of the conductive contact holder 3 that contains and holds the conductive contact 2, and a type of the test object. As long as the second contacting element 22 projects from the width-direction end of the second connecting element 25 in the width direction as described above, the details of its shape may be modified appropriately.

The conductive contact holder 3 is explained below. As shown in FIG. 1, an external shape of the conductive contact holder 3 is approximately cubic. The conductive contact holder 3 includes: a supporting element 31 penetrating through an upper wall 3a and a bottom wall (not shown in FIG. 1) for supporting a plurality of the conductive contacts 2; and fastening holes 32 that face each other and are formed on a predetermined position on side walls 3b, respectively, through the supporting element 31 for fastening ends of the bar-shaped member 4.

Figure 3:
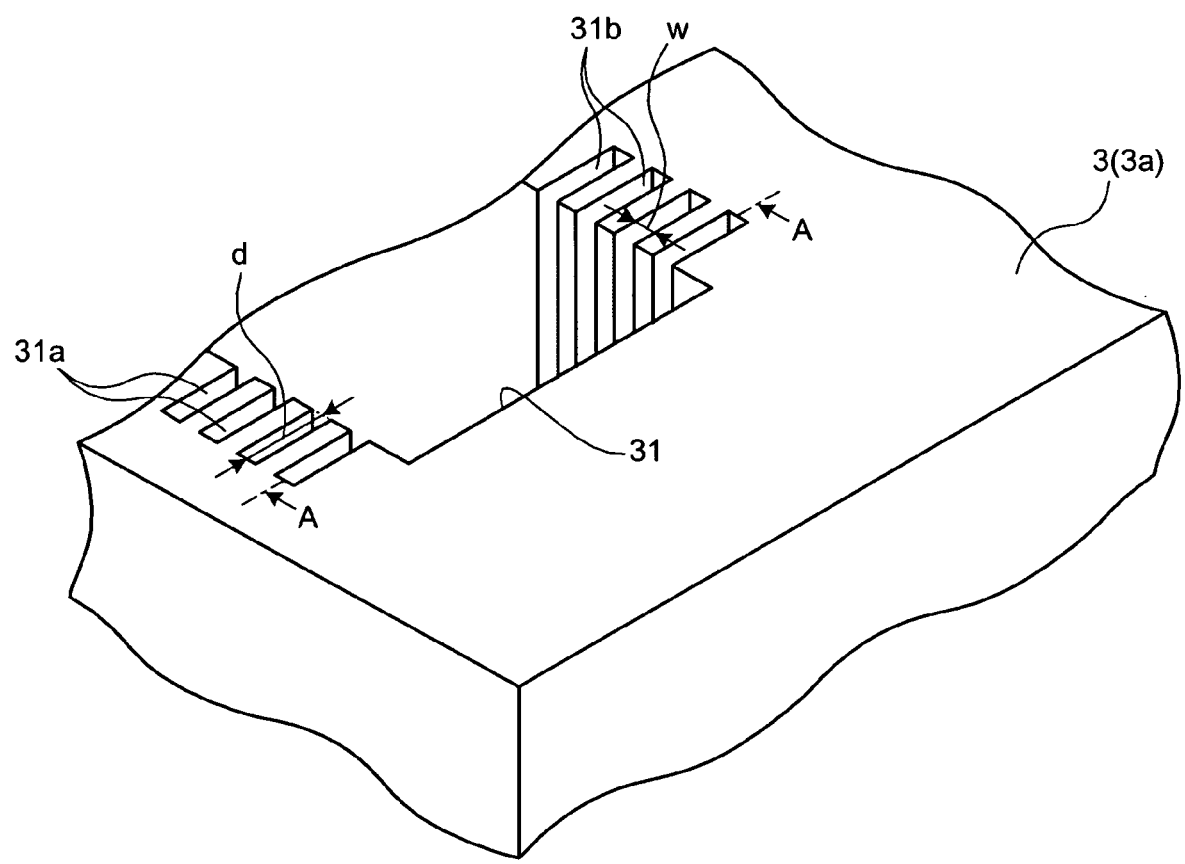
FIG. 3 is a partial enlarged perspective view of an upper wall of a conductive contact holder.

FIG. 3 is a partial enlarged perspective view of the upper wall 3a of the conductive contact holder 3. As shown in FIG. 3, the supporting element 31 includes a plurality of pairs of a linear first guiding groove 31a and a linear second guiding groove 31b. The first guiding groove 31a is engaged with and holds one of edges of the conductive contact 2 in the width direction when the conductive contact 2 is mounted. The second guiding groove 31b, positioned facing the first guiding groove 31a, is engaged with and holds the other edge of the conductive contact 2 that is embedded in the first guiding groove 31a in the width direction. The first guiding grooves 31a and the second guiding grooves 31b that are formed in pairs, function to align the conductive contacts 2 in a planar direction intersecting perpendicularly with the longitudinal direction, and to guide the extending action of the conductive contacts 2. The adjacent pairs of the first guiding grooves 31a and the second guiding grooves 31b have the same intervals, and are positioned in parallel to each other.

The first guiding grooves 31a and the second guiding grooves 31b has the same groove width (denoted as "w"), and the same groove depth (denoted as "d"). The value d of the groove depth is larger than the retracted amount r of the resilient element 23 of the conductive contact 2 (d>r). This enables the supporting element 31 to reliably hold the conductive contacts 2, without' disengaging the conductive contacts 2 from the first guiding grooves 31a and the second guiding grooves 31b. Although the first guiding grooves 31a and the second guiding grooves 31b are described as having the same groove depth, the both guiding grooves may have different groove depths from each other.

Figure 4:
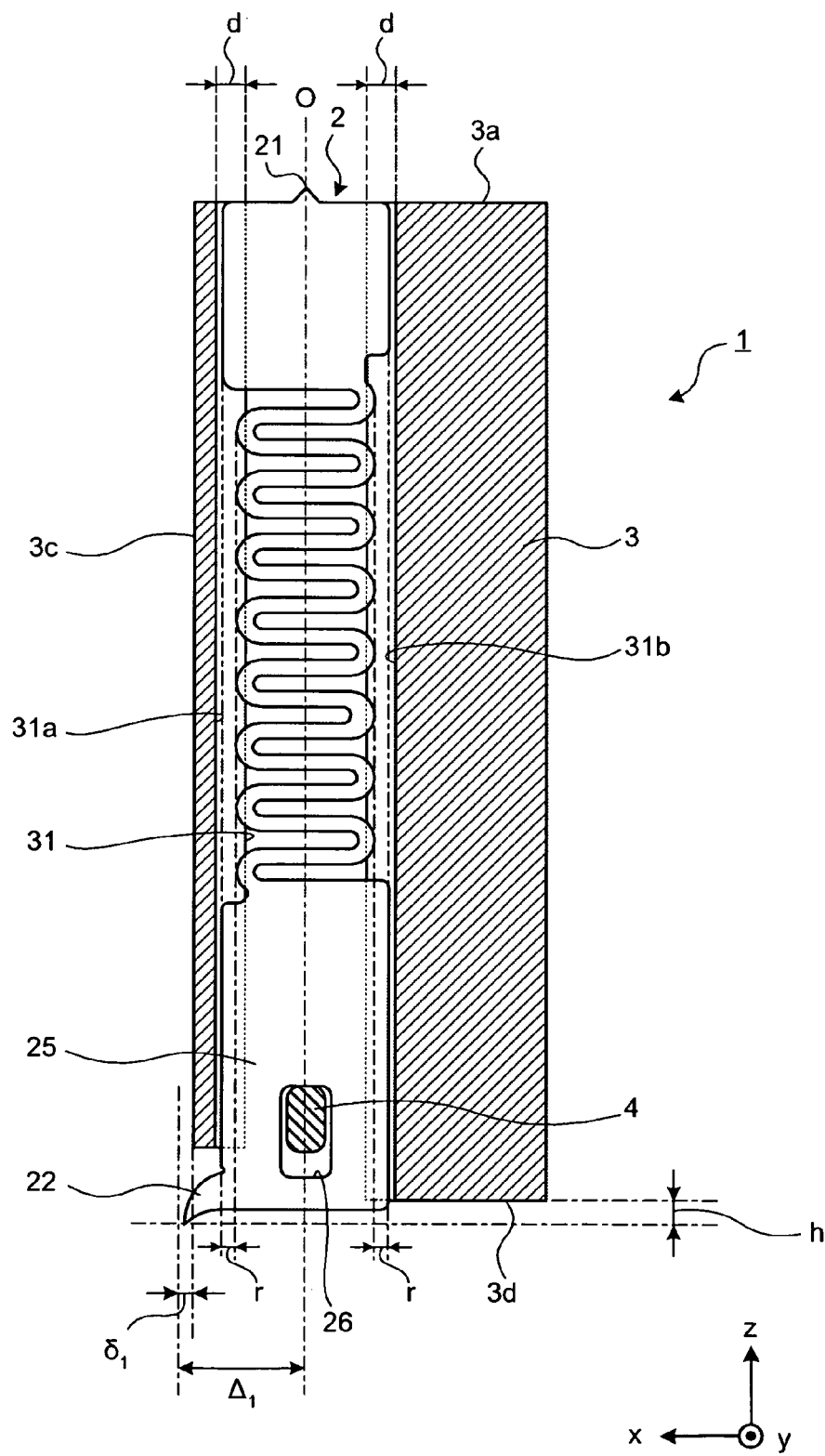
FIG. 4 is a diagram of an internal structure of the conductive contact unit according to the first embodiment.

FIG. 4 is a diagram of an internal structure of the conductive contact unit 1, including an internal structure of the supporting element 31 of the conductive contact holder 3. The portion of the conductive contact holder 3 shown in FIG. 4 corresponds to a cross section across a line A-A shown in FIG. 3. As shown in FIG. 4, the first guiding groove 31a and the second guiding groove 31b have structures that extend along a z axis (a direction perpendicular to the groove width direction and the groove depth direction), shown in FIG. 4, in parallel with each other. The first guiding groove 31a extends along the z axis direction shown in FIG. 4 for a length shorter than that the second guiding groove 31b extends along the same z axis direction. The second guiding groove 31b extends up to a bottom wall 3d of the conductive contact holder 3; however, the first guiding groove 31a only extends up to a position above the bottom wall 3d in the vertical direction.

The conductive contact holder 3 having such a structure holds the conductive contacts 2 positioned with their width direction, with their through-thickness direction in parallel with a y axis, and with their longitudinal direction in parallel with the z axis direction, in parallel with an x axis in a coordinate system (xyz) shown in FIGS. 1 and 4. Thus, the conductive contacts 2 have a uniform thickness that is slightly smaller than the groove width (w) of the first guiding grooves 31a etc. As is clear from FIG. 4, the retracted amount r of each of the conductive contacts 2 is set as a value that satisfies the relational expression d>r with the groove depth d of the first guiding groove 31a etc., and that falls in a range where the conductive contacts 2 are not disengaged from the first guiding grooves 31a and the second guiding grooves 31b when the conductive contacts 2 are held in the conductive contact holder 3.

The longitudinal length of the conductive contact 2 is designed so that: the bar-shaped member 4 penetrates through the opening 26; a tip of the second contacting element 22 projects by a predetermined amount from a side wall 3c of the conductive contact holder 3 in a positive direction in x axis (the projected length is denoted as "δ1") in a state applying no load to the first contacting element 21 and the second contacting element 22 (the state shown in FIG. 4); and the tip of the second contacting element 22 projects by a predetermined amount from the bottom wall 3d of the conductive contact holder 3 in a negative direction in z axis (the projected length is denoted as "h"). The tip of the second contacting element 22 is provided at a position offset by a predetermined distance (the offset is denoted as "$\Delta_1$") from a symmetric axis O that is in parallel with the longitudinal direction of the resilient element 23 or the first connecting element 24. The projected lengths δ1 and h, and the offset $\Delta_1$ are determined accordingly based on conditions such as a size of the conductive contact 2 or the conductive contact holder 3, or a load added to the test object.

The conductive contact holder 3 is preferably formed using an insulating material, from a view of preventing a short circuit caused by the conductive contact holder 3 electrically being connected to the conductive contacts 2. For example, the conductive contact holder 3 may be formed using a synthetic resin of low thermal expansion, and the first guiding grooves 31a and the second guiding grooves 31b may be formed thereon by dicing and the like. Alternatively, a base material for the conductive contact holder 3 may be formed using a ceramic such as alumina ($Al_2O_3$), zirconia ($ZrO_2$), or silica ($SiO_2$), a thermosetting resin such as a silicone, or an epoxy, an engineering plastic such as a polycarbonate or the like, and the first guiding grooves 31a and the second guiding grooves 31 may be formed with a processing technology such as etching. Alternatively, instead of using an insulating material for forming the conductive contact holder 3, other appropriate materials (regardless of the insulating property of the material) also can be used to form the base material and to apply an appropriate insulating coating over the areas that could possibly contact with the conductive contacts 2 (the area including the first guiding grooves 31a or the second guiding grooves 31b). Such insulating coating may be applied to part of or the entire surface of the conductive contacts 2.

The bar-shaped member 4 is explained below. The bar-shaped member 4 mounts the conductive contacts 2 onto the supporting element 31. After inserting through the opening 26 of each of the conductive contacts 2, the both ends of the bar-shaped member 4 are inserted into the fastening holes 32, each of which is formed on the side walls 3b that face each other in the conductive contact holder 3, and the bar-shaped member 4 is fixed onto the conductive contact holder 3. The bar-shaped member 4 functions to prevent the conductive contacts 2 from being disengaged from the supporting element 31, by penetrating through all of the openings 26 of the conductive contacts 2 that are held in the supporting element 31, as well as to give an initial flexure to the conductive contacts 2.

A cross section of the bar-shaped member 4, sectioned in perpendicular with the longitudinal direction, has a rectangular shape with chamfered corners, and the area thereof is smaller than that of the opening 26 of the conductive contact 2. Such a cross-sectional shape enables a process, performed for forming the fastening holes 32 with respect to the conductive contacts 2, to be simplified. The above-described cross-sectional shape also enables the conductive contacts 2 to move smoothly when a load is applied to the conductive contacts 2, and ensures stability in supporting the bar-shaped member 4 when a predetermined load is applied to the conductive contacts 2. Moreover, when the test object is brought into contact with the conductive contacts 2, the opening 26 becomes separated from the bar-shaped member 4, enabling the opening 26 to move freely with respect to the bar-shaped member 4. As a result, the conductive contacts 2 can be rotated slightly, as described later.

The cross-sectional shape of the bar-shaped member 4, sectioned in perpendicular to the longitudinal direction, is not limited to the above, and may be a polygonal, a square, or a circle, for example. It should be needless to say that the shape of the fastening hole 32 is changed according to the cross-sectional shape of the bar-shaped member 4.

The bar-shaped member 4 having the above structure is also formed using an insulating material. Because this bar-shaped member 4 penetrates through the openings 26 of a number of the conductive contacts 2 to support all of the penetrated conductive contacts 2, the bar-shaped member 4 is preferably made of an insulating material such as a ceramic, with high rigidity, and with small flexure generated upon application of a load.

Figure 5:
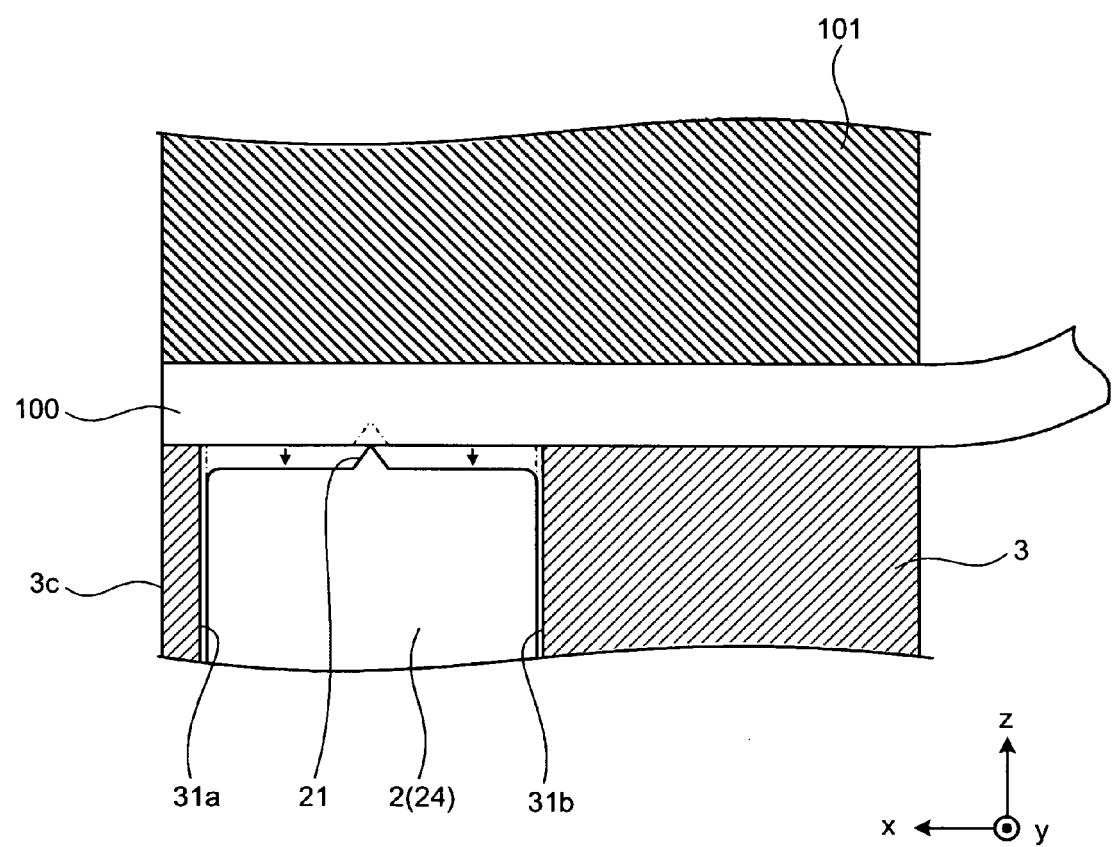
FIG. 5 is a partial enlarged view of an upper portion of the conductive contact holder attached with a circuit substrate that is connected to a test circuit.

FIG. 5 is a partial enlarged view of the upper portion of the conductive contact holder 3 attached with a circuit substrate for establishing an electrical connection with a signal processing circuit that generates and outputs a test signal. For the purpose of comparison, the position of the conductive contact 2 shown in FIG. 4 is indicated with a dotted line. A circuit substrate 100 shown in FIG. 5 has a plurality of wires and connecting electrodes, made of a material such as nickel, formed on one surface of the sheet-like substrate made of a material such as polyimide.

FIG. 5 illustrates an arrangement where the electrodes of the circuit substrate 100 are aligned so as to be brought into contact with the first contacting elements 21 of the conductive contacts 2, and the circuit substrate 100 is held between the a fixing member 101, made of the same material as the conductive contact holder 3, and the conductive contact holder 3. To fix the circuit substrate 100 onto the conductive contact unit 1, the conductive contact holder 3 and the fixing member 101 may be fixed together with screws (not shown), for example. If the arrangement transits from the state shown in FIG. 4 to that shown in FIG. 5, a load (initial load), other than the gravity, acting upon the conductive contacts 2, is applied to each of the conductive contacts 2, shrinking each of the resilient elements 23 in the longitudinal direction.

In a known conductive contact unit, a plate-like covering member has been used for applying the initial load to the conductive contacts. However, when such a covering member is used, the contacting element located at the tip of the conductive contact needed to be projected further by a distance equal to the thickness of the covering member. Thus, it has been a problem that a greater area becomes unstable when the load is applied, and the area near the tip could become bent easily. Because the conductive contact unit 1 does not use the covering member, the problem is no longer occurring, and the size of the first contacting element 21 can be dramatically reduced in comparison with the known example.

Figures 1, 6:
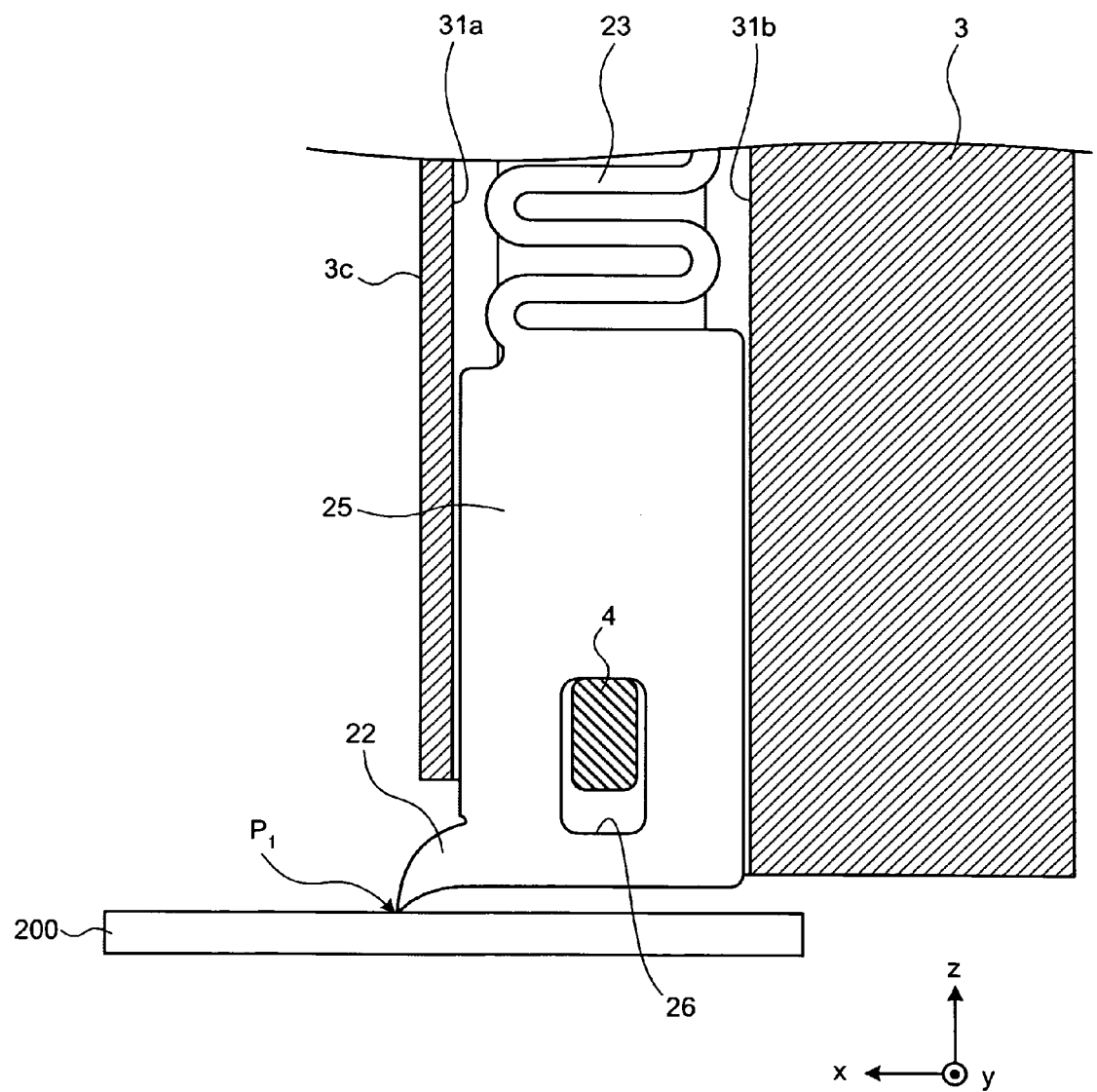
Figures 2, 6:
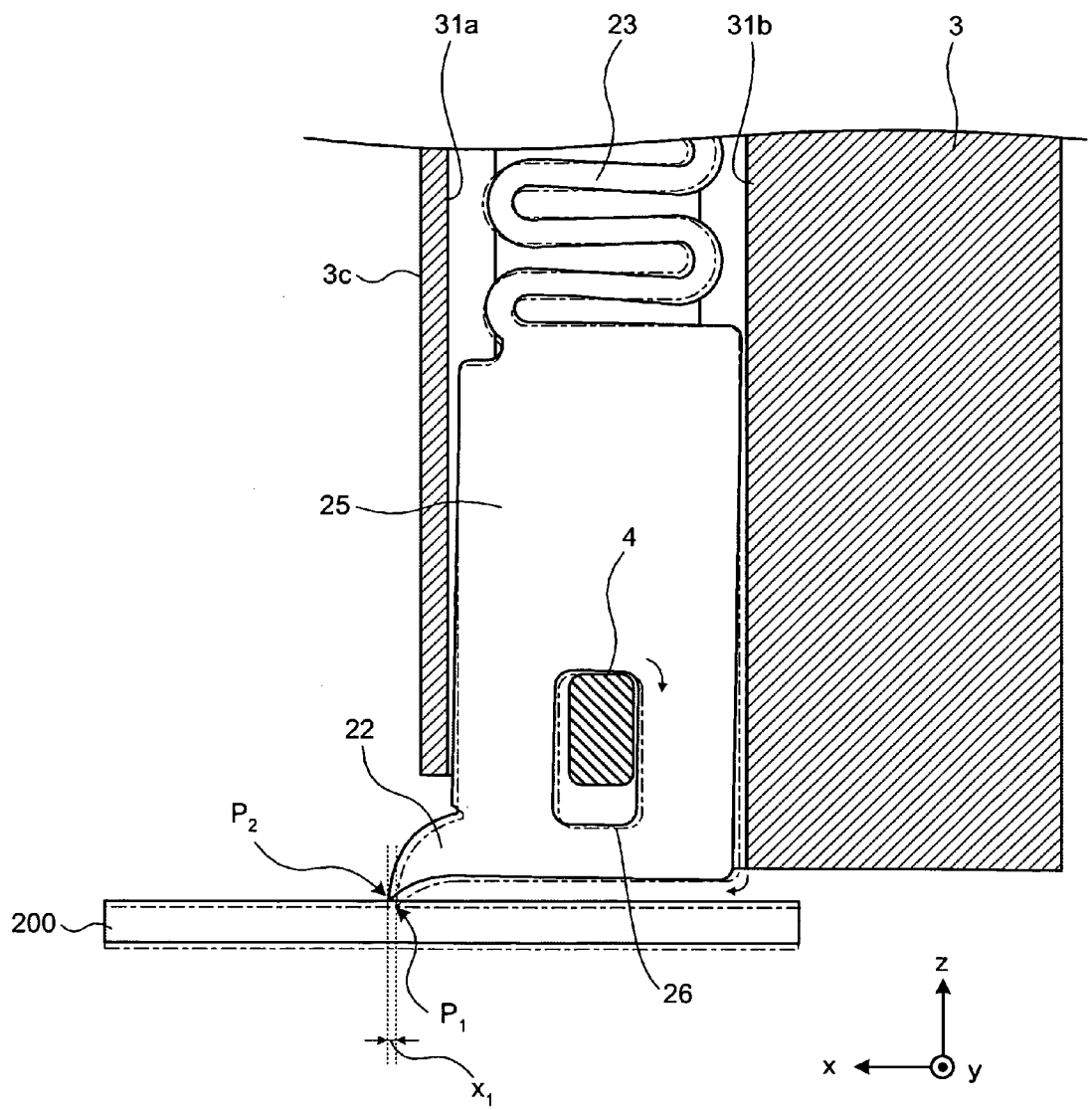

An illustrative embodiment of a contact between conductive contact unit 1 and the test object is explained below. FIG. 6-1 is a diagram of an area near the bottom end of the conductive contact 2 immediately after a test object 200 is brought into contact with the second contacting elements 22 of the conductive contacts. FIG. 6-2 is a diagram of the area near the bottom end of the conductive contact 2 when the test object 200 is elevated to a test position. In FIG. 6-2, the position of the conductive contact 2 immediately after the contact is established is shown in dotted line for the purpose of comparison.

The tip of the second contacting element 22 is offset by $\Delta_1$ from the longitudinal symmetric axis (central axis) O of the resilient element 23 or the first connecting element 24, as described above with reference to FIG. 4. Therefore, the line of action of the load acting upon the tip of the second contacting element 22 that is brought into contact with the test object 200 does not go through the center of gravity of the conductive contact 2. Thus, a moment is generated in the conductive contact 2. As a result, the resilient element 23 shrinks and the opening 26 is moved away from the bar-shaped member 4. Due to this moment, the conductive contact 2 rotates slightly, while the conductive contact 2 goes through the transition from the state shown in FIG. 6-1 to that shown in FIG. 6-2. This rotation is generated because a small gap is present between the edge of the resilient element 23 and the first guiding groove 31a, and the other edge thereof and the second guiding groove 31b, respectively, in the width direction. This rotation is generated because a small gap is present between the end of the resilient element 23 and the first guiding groove 31a, and the other end thereof and the second guiding groove 31b, respectively, in the width direction, and because a cross-sectional area perpendicular to the through-thickness direction of the bar-shaped member 4 is smaller than the area of the opening 26.

Due to this rotation, the second contacting element 22 slightly rotates in a clockwise direction in FIG. 6-2, and moves along the surface of the test object 200 while keeping in contact with the test object 200. More specifically, the tip of the second contacting element 22 slides from an initial contact point $P_1$ to a final contacting point $P_2$, scratching the surface of the test object 200, to move in the x axis direction by a distance of $x_1 (>0)$. In this manner, while the tip of the second contacting element 22 is moved on the surface of the test object 200, the oxidized film or dust accumulated to the surface thereof is removed, ensuring a stable electrical contact between the second contacting elements 22 and the test object 200. If the movement speed (elevating speed) of the test object 200 is controlled appropriately at this time, not only the surface of the test object 200 can be protected from being damaged greatly by the tips of the second contacting elements 22, but also the conductive contacts 2 can be prevented from being applied with an excessive load.

While the arrangement transits from the state shown in FIG. 6-1 to that shown in FIG. 6-2, the resilient element 23 also rotates only by a small angle. During this time, the resilient element 23 is resiliently deformed, being shrunk by the load. Such resilient deformation is slightly different depending on the pitch of a spring constituting the resilient element 23. However, regardless of how the resilient element 23 is resiliently deformed, the resilient element 23 is unlikely to come into contact with the bottom of the second guiding grooves 31b and cause friction, because the resilient element 23 has the retracted amount r toward the center thereof from each end of the second connecting element 25 and thus has a width smaller than the width of the second connecting element 25.

As described above, according to the first embodiment, the conductive contact 2 has the retracted amount r, which is set in a range where the conductive contact 2 is not disengaged from the first guiding groove 31a and the second guiding groove 31b. Thus, even when a load is applied to the resilient element 23, the edges of the resilient element 23 are not brought into contact with the bottom of the first guiding grooves 31a and the bottom of the second guiding grooves 31b. This makes it possible to reduce friction between the resilient element 23 and the bottoms of the guiding grooves, and to prevent the resilient element 23 from being caught up when the conductive contact 2 slides, enabling the conductive contact 2 to be capable of being reliably restored to its original position. It is also possible to reduce the amount of wear powder to be generated due to the friction, preventing the test object 200 from being contaminated with the wear powder.

According to the first embodiment, the conductive contact 2 has a small sliding resistance with the conductive contact holder 3, so that the conductive contact 2 can have a stabilized testing load with less variation. This allows use of a spring with a small load as the resilient element 23, and reduces stress to be applied to the resilient element 23, allowing the conductive contact 2 to have improved durability against the stress repeatedly applied. In addition, with a small load, deformation of the tip of the second contacting element 22 is prevented. Thus, the conductive contact 2 achieves improved durability in this regard also.

The conductive contact unit 1 described above holds the conductive contacts 2 by engaging parts of the conductive contacts 2 into the first guiding grooves 31a and the second guiding grooves 31b laid in the direction that the resilient element 23 of the conductive contacts 2 is extensible. Therefore, a problem of buckling or twisting due to the shrinkage, of the resilient element 23, which is unique to the plate-like conductive contact 2, can be prevented from occurring. Furthermore, the spring characteristic of the resilient element 23 can be prevented from deteriorating due to the problem as above. In this manner, a large stroke can be achieved without causing buckling or twisting, even when a certain or more load within an appropriate range is applied to the conductive contact 2, and a desirable contact can be obtained between the second contacting elements 22 and the test object 200.

In the conductive contact unit 1, the conductive contacts 2 are held by the first guiding grooves 31a and the second guiding grooves 31b. Therefore, it is possible to reduce a sliding resistance by reducing the area of the conductive contact 2 being in contact with (the supporting element 31 of) the conductive contact holder 3, enabling the conductive contacts 2 to be extended smoothly.

In the conductive contact unit 1, it is sufficient if the groove width (w) of the first guiding grooves 31a and the second guiding grooves 31b is approximately the same as the thickness of the conductive contacts 2. Besides, each of the intervals between the adjacent first guiding grooves 31a or the adjacent second guiding grooves 31b can be reduced to a given small value, as long as the insulation between the adjacent conductive contacts 2 is ensured. Therefore, it is possible to reduce the arrangement intervals between the conductive contacts 2, and to support the small arrangement intervals between the connecting electrodes or terminals of the contacted circuitries.

In addition, in the conductive contact unit 1, the bar-shaped member 4 penetrates through the conductive contacts 2 to give the initial flexure onto the conductive contacts 2, as well as to prevent the conductive contacts 2 from being disengaged. As a result, it is possible to reduce the distance h of the tip of the second contacting element 22, that is, the lower end of the conductive contact 2 projecting in the vertical direction below the bottom wall 3d of the conductive contact holder 3. In other words, the size of the second contacting element 22 can be reduced, and the tip of the conductive contact 2 can be prevented from being bent, and the conductive contact 2 can be supported in a stable manner. Thus, the conductive contacts 2 can be prevented from being disengaged from the first guiding grooves 31a and/or the second guiding grooves 31b near the bottom area thereof. As a result, a position precision of the conductive contacts 2 can be improved, and reliability and durability of the conductive contact unit 1 can also be improved.

When the conductive contact unit 1 is assembled, a process for putting the conductive contacts 2 into the supporting element 31 is completed by inserting the conductive contact 2 into the supporting element 31 from the side of the first contacting element 21, and by fitting the width-direction edges in the first guiding groove 31a and the second guiding groove 31b. Therefore, the assembly is easier in comparison with the known conductive contact unit. Moreover, the production cost can be advantageously reduced.

As described above, according to the first embodiment of the present invention, a conductive contact includes: a first contacting element that is brought into physical contact with one of different circuitries; a second contacting element that is brought into physical contact with one of the different circuitries other than that brought into contact with the first contacting element; a resilient element that is interposed between the first contacting element and the second contacting element in a longitudinal direction, and is extensible in the longitudinal direction; a first connecting element that connects the resilient element and the first contacting element; and a second connecting element that connects the resilient element and the second contacting element, and has an opening penetrating therethrough in a through-thickness direction. In the conductive contact, at least a portion of the resilient element is shorter than the first connecting element and the second connecting element in a width direction perpendicular to the longitudinal direction and the through-thickness direction. Thus, the conductive contact is capable of being reliably restored to its original position with less variation in the loads as well as having high durability.

According to the first embodiment, a portion (the second contacting element) where the conductive contact is brought into contact with a test object projects in the width direction toward outside of the conductive contact holder. This enables an operator to easily perform visual or microscopic observation from the top of the conductive contact unit during actual testing, and to perform testing operations while checking physical contact between the tip of the conductive contact and the test object. Accordingly, the operator no longer needs to bend over to observe the contact between the conductive contact and the test object. This further improves testing workability and reliability, also reducing the operator's burden.

According to the first embodiment, the conductive contact has a plate-like external shape. This makes it possible to support narrower arrangement intervals, and to achieve a stable electrical contact without applying an excessive load.

Modification of First Embodiment

Figure 7:
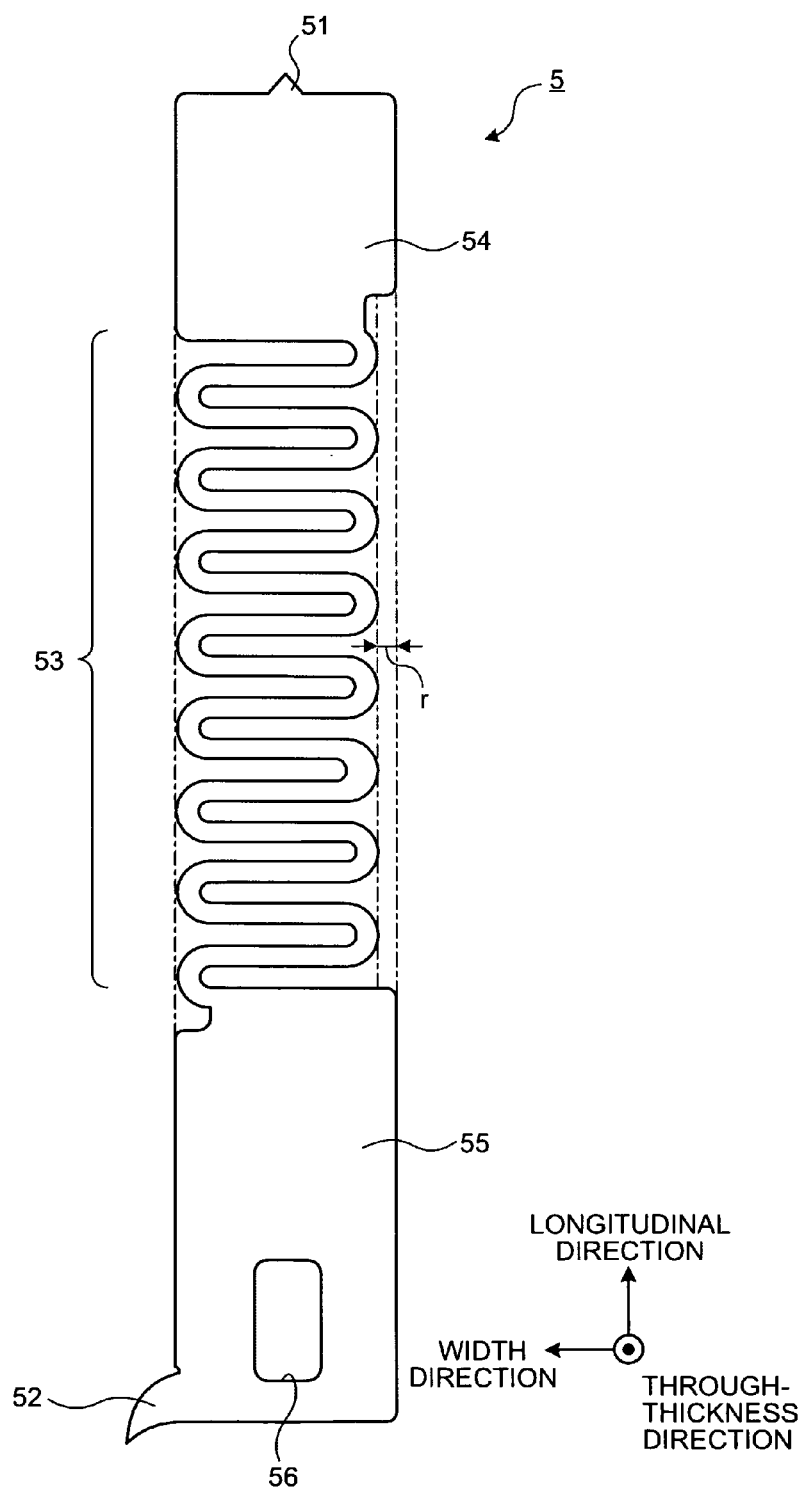
FIG. 7 is a diagram of a structure of a conductive contact according to a first modification of the first embodiment of the present invention.

FIG. 7 is a diagram of a structure of a conductive contact according to a first modification of the first embodiment. The conductive contact 5 shown in FIG. 7 includes a first contacting element 51, a second contacting element 52, a resilient element 53, a first connecting element 54, a second connecting element 55, and an opening 56, in the same manner as in the conductive contact 2. In the present modification also, a conductive contact unit is configured with the conductive contact holder 3 containing a plurality of conductive contacts 5.

As in the first embodiment, the resilient element 53 is arranged such that only a side thereof that approaches the bottom wall of the second guiding groove 31b when the tip of the second contacting element 52 is brought into contact with the test object 200 (an edge opposite where the second contacting element 52 is provided), i.e., only an edge on the right side of FIG. 7, is retracted toward the center of the conductive contact 5 in the width direction than the edge of the first connecting element 54 and the second connecting element 55 (retracted amount r). Elements other than the resilient element 53 have the same shapes as corresponding elements of the conductive contact 2.

Figure 8:
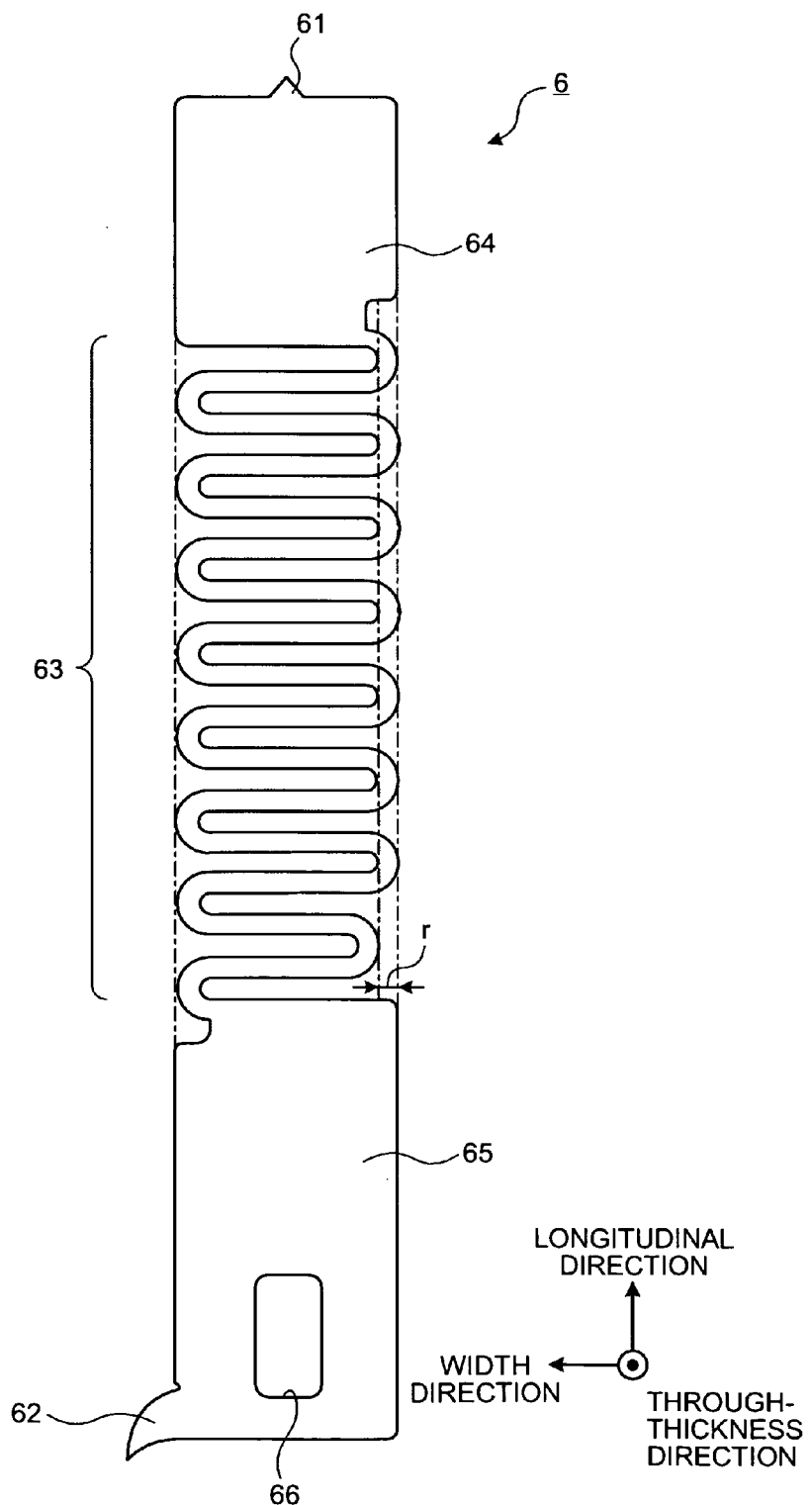
FIG. 8 is a diagram of a structure of a conductive contact according to a second modification of the first embodiment of the present invention.

FIG. 8 is a diagram of a structure of a conductive contact according to a second modification of the first embodiment. The conductive contact 6 shown in FIG. 8 includes a first contacting element 61, a second contacting element 62, a resilient element 63, a first connecting element 64, a second connecting element 65, and an opening 66, in the same manner as in the conductive contact 2. Further, as in the first embodiment, a conductive contact unit is configured with the conductive contact holder 3 containing a plurality of the conductive contacts 6.

As in the first embodiment, the resilient element 63 has runout, i.e., is retracted, relative to the side surfaces of the first connecting element 64 and the second connecting element 65, only in a portion where large buckling occurs on a side that approaches the bottom wall of the second guiding groove 31b when the tip of the second contacting element 62 is brought into contact with the test object 200.

In FIG. 8, a portion provided with the retracted amount r is located at a pitch closest to the second connecting element 65. Needless to say, this is only an example, and the portion provided with the retracted amount may be changed according to the shape of the conductive contact. In this regard, the location (pitch) to be provided with the runout may be added and/or changed according to the shape of the conductive contact, and the retracted amount may be changed at each location.

According to the two modifications of the first embodiment as described above, the number of portions provided with the runout is reduced considering the shape of the second contacting element, so that the area of the resilient element itself is increased. This achieves the same effect as in the first embodiment, and also enables the conductive contact to have further improved durability.

Second Embodiment

Figure 9:
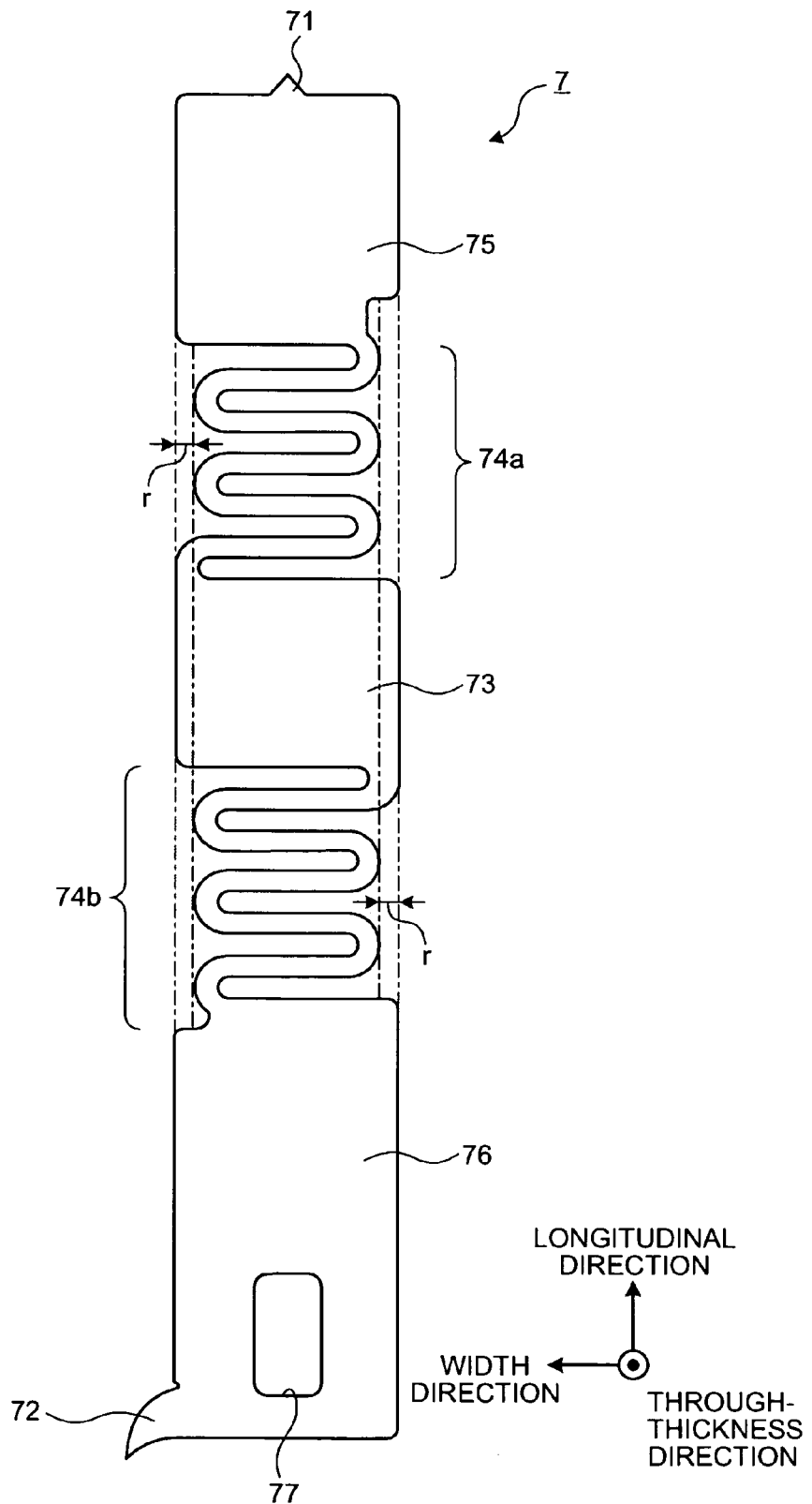
FIG. 9 is a diagram of a structure of a conductive contact according to a second embodiment of the present invention.

FIG. 9 is a diagram of a structure of a conductive contact according to a second embodiment of the present invention. The conductive contact 7 shown in FIG. 9 is formed in a plate-like shape using a conductive material. By putting a plurality of conductive contacts 7 in the conductive contact holder 3 described in the first embodiment, a conductive contact unit according to the second embodiment can be configured.

According to the second embodiment of the present invention, the conductive contact 7 includes: a first contacting element 71 that is brought into physical contact with a predetermined circuitry (specifically, a circuitry having a test circuit); a second contacting element 72 that is brought into physical contact with a circuitry other than the circuitry brought into contact with the first contacting element 71 (specifically, a test object such as a liquid crystal panel); a plate element 73 that is interposed between the first contacting element 71 and the second contacting element 72; a resilient element 74a that is interposed between the first contacting element 71 and the plate element 73, and is extensible in a longitudinal direction thereof; and a first connecting element 75 that connects the first contacting element 71 and the resilient element 74a. The conductive contact 7 further includes: a resilient element 74b that is interposed between the second contacting element 72 and the plate element 73, and is extensible in a longitudinal direction thereof; and a second connecting element 76 that connects the second contacting element 72 and the resilient element 74b, and that has an opening 77 penetrating therethrough in a through-thickness direction. The plate element 73 has the same width as the first connecting element 75 and the second connecting element 76.

The second contacting element 72 projects from a width-direction edge of the second connecting element 76, in a direction away from the center of the conductive contact 7. Further, the resilient element 74a and the resilient element 74b has a width smaller than the width of the first connecting element 75 and the second connecting element 76 by 2r, so that edges of the resilient element 74a and the resilient element 74b are retracted toward the center of the conductive contact 7 in the width direction than edges of the first connecting element 75 and the second connecting element 76. Such retracted amount of each of the resilient elements 74a and 74b is r and equally provided from the both respective edges of the first connecting element 75 (and the second connecting element 76) in the width direction. A specific value for the retracted amount r is decided according to the groove depth of the first guiding grooves 31a and the second guiding grooves 31b for holding the resilient elements 74a and 74b in the conductive contact holder 3 or other factors.

In FIG. 9, the first connecting element 75, the second connecting element 76, and the plate element 73 have equal widths, and the resilient elements 74a and 74b have a width smaller than the width of the first connecting element 75 etc. by 2r. The plate element 73 may have a width smaller than the width of the first connecting element 75 and the second connecting element 76. As in the modifications of the first embodiment, the runout may be provided only in a portion of the resilient elements 74a and 74b, and the retracted amount may be different at each portion along the longitudinal direction.

According to the second embodiment of the present invention as described above, the conductive contact, and the conductive contact unit using the conductive contact are provided, in which the conductive contact is capable of being reliably restored to its original position with less variation in the loads, and achieves excellent durability.

According to the second embodiment, the plate element is provided that divides a resilient element of the conductive contact into two pieces to be arranged along the longitudinal direction. Accordingly, a sliding clearance relative to the bottom of the first guiding groove and the bottom of the second guiding groove is made small so that wobbling movement is reduced. This prevents the first resilient element and the second resilient element from being disengaged from the guiding grooves, and from being deformed in directions other than the longitudinal direction.

Figure 10:
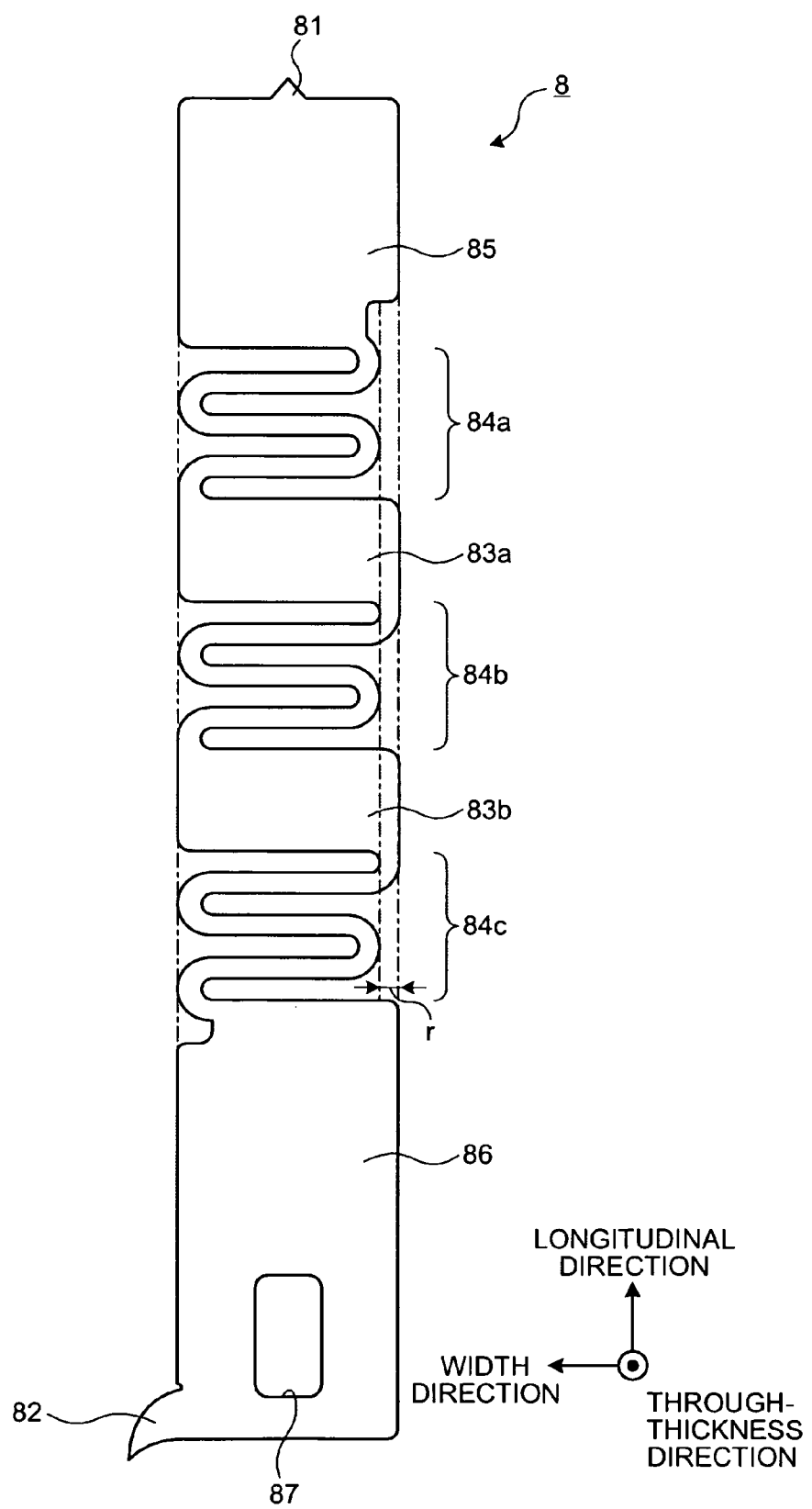
FIG. 10 is a diagram of an internal structure of a conductive contact unit according to the second embodiment.

FIG. 10 is a diagram of a structure of a conductive contact according to a modification of the second embodiment. A conductive contact 8 shown in FIG. 10 includes two plate elements 83a and 83b, and three resilient elements (resilient elements 84a, 84b, and 84c) with these two plate elements in between. Each of the resilient elements 84a to 84c is arranged such that an edge thereof that approaches the second guiding groove 31b upon application of a load (an edge opposite where a second contacting element 82 is provided) is retracted toward the center of the conductive contact 8 (retracted amount r). A first contacting element 81, the second contacting element 82, a first connecting element 85, and a second connecting element 86 (including an opening 87) have the same structures as corresponding elements of the conductive contact 7.

As is clear from FIG. 10, the number of plate elements that divide the resilient element into pieces to be arranged along the longitudinal direction may be changed appropriately based on conditions such as the shape of the conductive contact. The location where the runout is provided in the resilient element, and the retracted amount relative to the other elements may also be changed based on conditions such as the shape of the conductive contact.

Other Embodiments

The first and the second embodiments are described above in detail as best modes for carrying out the present invention. However, the present invention is not restricted only to these two embodiments. For example, at least a portion of the resilient element needs to be smaller than the other portions in width, and be retracted toward the center of the main body of the conductive contact, relative to the edge of the other portions. As long as being in a plate-like shape, the other portions may be in any shape other than those described above.

Furthermore, in addition to the test of the liquid crystal panel, the conductive contact unit according to embodiments of the present invention can also be applied to a test of a package board mounted with a semiconductor chip, or a high density probe unit used for performing a wafer-level test.

As described above, the present invention may include various embodiments that are not described herein, and is susceptible to various design changes or modifications and the like within the scope of the technological concept defined by the claims.

INDUSTRIAL APPLICABILITY

The conductive contact and the conductive contact unit according to embodiments of the present invention are useful for testing the conducting state and operating characteristics of an electronic component, such as a liquid crystal panel or a semiconductor integrated circuit, and are particularly suitable for a test object with connecting terminals arranged at smaller intervals.

The invention claimed is:

1. A conductive contact in a plate-like shape that establishes an electrical connection between different circuitries, and receives and outputs an electrical signal from and to the circuitries, the conductive contact comprising:
   a first contacting element that is brought into physical contact with one of the different circuitries;
   a second contacting element that is brought into physical contact with one of the different circuitries other than the one the first contacting element is brought into contact with;
   a resilient element that is interposed between the first contacting element and the second contacting element along a longitudinal direction, and is expandable and contractible in the longitudinal direction;
   a first connecting element that connects the resilient element and the first contacting element; and
   a second connecting element that connects the resilient element and the second contacting element, and has an opening penetrating therethrough in a through-thickness direction;
   wherein at least a portion of the resilient element is shorter than the first connecting element and the second connecting element in a width direction perpendicular to the longitudinal direction and the through-thickness direction,
   wherein the second contacting element projects from a first edge in the width direction of the second connecting element in a direction away from a center of the conductive contact, and
   wherein the resilient element has at least a portion whose edge, on a side of a second edge in the width direction of the second connecting element opposite the first edge, is retracted toward the center of the conductive contact more than the second edge.

2. The conductive contact according to claim 1, wherein the resilient element has portions that have different lengths in the width direction.

3. The conductive contact according to claim 1, further comprising at least one plate element that divides the resilient element into pieces to be arranged along the longitudinal direction.

4. The conductive contact according to claim 3, wherein the plate element is equal in length in the width direction to at least one of the first connecting element and the second connecting element.

5. A conductive contact in a plate-like shape that establishes an electrical connection between different circuitries, and receives and outputs an electrical signal from and to the circuitries, the conductive contact comprising:
- a first contacting element that is brought into physical contact with one of the different circuitries;
- a second contacting element that is brought into physical contact with one of the different circuitries other than the one the first contacting element is brought into contact with;
- a resilient element that is interposed between the first contacting element and the second contacting element along a longitudinal direction, and is expandable and contractible in the longitudinal direction;
- a first connecting element that connects the resilient element and the first contacting element; and
- a second connecting element that connects the resilient element and the second contacting element, and has an opening penetrating therethrough in a through-thickness direction;
- wherein at least a portion of the resilient element is shorter than the first connecting element and the second connecting element in a width direction perpendicular to the longitudinal direction and the through-thickness direction,
- wherein the second contacting element projects from a first edge in the width direction of the second connecting element in a direction away from a center of the conductive contact, and
- wherein the resilient element has at least a portion whose edge, on a side of the first edge, is retracted toward the center of the conductive contact more than the first edge.

6. The conductive contact according to claim 5, wherein the resilient element has portions that have different lengths in the width direction.

7. The conductive contact according to claim 5, further comprising at least one plate element that divides the resilient element into pieces to be arranged along the longitudinal direction.

8. The conductive contact according to claim 7, wherein the plate element is equal in length in the width direction to at least one of the first connecting element and the second connecting element.

9. A conductive contact unit, comprising:
a plurality of conductive contacts, each of which includes
- a first contacting element that Is brought into physical contact with one of different circuitries;
- a second contacting element that is brought into physical contact with one of the different circuitries other than the one the first contacting element is brought into contact with;
- a spring-like resilient element that is interposed between the first contacting element and the second contacting element along a longitudinal direction, and is expandable and contractible in the longitudinal direction;
- a plate-like first connecting element that connects the resilient element and the first contacting element; and
- a plate-like second connecting element that connects the resilient element and the second contacting element, and has an opening penetrating therethrough in a through-thickness direction;
- a conductive contact holder that accommodates the conductive contacts, and includes
- a plurality of first guiding grooves each engaging one longitudinal edges of, the first connecting element, and the second connecting element to hold the conductive contact; and
- a plurality of second guiding grooves each located opposite to corresponding one of the first guiding grooves, and engaging the other longitudinal edges of the resilient element, the first connecting element and the second connecting element, to hold the conductive contact; and
- a bar-shaped member that penetrates through the opening formed on the second connecting element of each of the conductive contacts accommodated in the conductive contact holder, and is fixed to the conductive contact holder,
- wherein the second contacting element projects from a side wall of the conductive contact holder in a width direction perpendicular to the longitudinal direction and the through-thickness direction,
- in each of the conductive contacts, at least a portion of the resilient element is shorter than the first connecting element and the second connecting element in the width direction, and
- each of the conductive contacts is configured such that when the second contacting element is brought into contact with the circuitry, the resilient element resiliently deforms while being held by the first and second guiding grooves without being brought into contact with bottoms of the first and second guiding grooves.

10. The conductive contact unit according to claim 9, wherein a cross-sectional area of the bar-shaped member perpendicular to a longitudinal direction is smaller than an area of the opening formed on each of the conductive contacts.

* * * * *